United States Patent
Lee et al.

(10) Patent No.: US 12,382,672 B2
(45) Date of Patent: Aug. 5, 2025

(54) EPITAXIAL WAFER AND SEMICONDUCTOR MEMORY DEVICE USING THE SAME

(71) Applicant: SAMSUNG ELECTRONICS CO., LTD., Suwon-si (KR)

(72) Inventors: Junga Lee, Suwon-si (KR); Yeonsook Kim, Hwaseong-si (KR); Wooseung Jung, Busan (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 163 days.

(21) Appl. No.: 17/977,013

(22) Filed: Oct. 31, 2022

(65) Prior Publication Data
US 2023/0141135 A1    May 11, 2023

(30) Foreign Application Priority Data
Nov. 9, 2021   (KR) .................. 10-2021-0153445

(51) Int. Cl.
*H10D 30/69*     (2025.01)
*H10B 12/00*     (2023.01)
*H10D 62/815*    (2025.01)

(52) U.S. Cl.
CPC ........... *H10D 30/792* (2025.01); *H10B 12/30* (2023.02); *H10D 62/8164* (2025.01)

(58) Field of Classification Search
None
See application file for complete search history.

(56) References Cited

U.S. PATENT DOCUMENTS

| | | |
|---|---|---|
| 7,170,126 B2 | 1/2007 | Cheng et al. |
| 7,544,976 B2 | 6/2009 | Aulnette et al. |
| 7,998,835 B2 | 8/2011 | Teo et al. |
| 9,406,799 B2 | 8/2016 | Nayak |
| 9,627,381 B1* | 4/2017 | Balakrishnan ............... H01L 21/823892 |
| 9,871,140 B1 | 1/2018 | Balakrishnan et al. |
| 2004/0227158 A1* | 11/2004 | Delhougne ......... H01L 21/0262 257/202 |
| 2005/0082567 A1 | 4/2005 | Chen et al. |
| 2008/0142844 A1* | 6/2008 | Aulnette ............... H10D 62/822 257/E29.085 |
| 2009/0179226 A1* | 7/2009 | Teo ..................... H10D 30/751 438/455 |
| 2011/0278645 A1* | 11/2011 | Teo ....................... H01L 29/165 257/190 |
| 2016/0218181 A1* | 7/2016 | Yang ................ H01L 21/02488 |
| 2016/0372552 A1* | 12/2016 | Balakrishnan .... H01L 21/02532 |
| 2017/0213820 A1* | 7/2017 | Balakrishnan ........ H01L 27/092 |
| 2017/0229542 A1* | 8/2017 | Balakrishnan ........ H01L 21/845 |

(Continued)

*Primary Examiner* — Khaja Ahmad
(74) *Attorney, Agent, or Firm* — Muir Patent Law, PLLC

(57) ABSTRACT

An epitaxial wafer and a semiconductor memory device, the epitaxial wafer including a semiconductor substrate having a front surface and a rear surface opposite to each other; a strain relaxed buffer (SRB) layer on and entirely covering the front surface of the semiconductor substrate; and a multi-stack on and entirely covering a surface of the SRB layer, wherein the SRB layer includes a silicon germanium (SiGe) epitaxial layer including germanium (Ge) at a first concentration of about 2.5 at % to about 18 at %, and the multi-stack has a superlattice structure in which a plurality of silicon (Si) layers and a plurality of SiGe layers are alternately provided.

19 Claims, 10 Drawing Sheets

(56) References Cited

U.S. PATENT DOCUMENTS

| | | | |
|---|---|---|---|
| 2018/0175199 A1* | 6/2018 | Kim | H10D 30/62 |
| 2020/0035820 A1 | 1/2020 | Zhang et al. | |
| 2020/0091287 A1 | 3/2020 | Glass et al. | |
| 2022/0254784 A1* | 8/2022 | Lee | H10B 12/02 |
| 2023/0015575 A1* | 1/2023 | Huang | H10B 10/125 |

* cited by examiner

EPITAXIAL WAFER AND SEMICONDUCTOR MEMORY DEVICE USING THE SAME

CROSS-REFERENCE TO RELATED APPLICATION

This application is based on and claims priority under 35 U.S.C. § 119 to Korean Patent Application No. 10-2021-0153445, filed on Nov. 9, 2021, in the Korean Intellectual Property Office, the disclosure of which is incorporated by reference herein in its entirety.

BACKGROUND

1. Field

Embodiments relates to an epitaxial wafer and a semiconductor memory device using the epitaxial wafer.

2. Description of the Related Art

Recently, the degrees of integration of semiconductor memory devices have increased with the development of electronics technology. The degrees of integration of two-dimensional semiconductor memory devices may still be limited despite continuous increase, and thus, three-dimensional semiconductor memory devices may be used. In addition, semiconductor memory devices require not only a fast operation speed but also operation accuracy, and thus, structures of transistors included in the semiconductor memory devices may be optimized.

SUMMARY

The embodiments may be realized by providing an epitaxial wafer including a semiconductor substrate having a front surface and a rear surface opposite to each other; a strain relaxed buffer (SRB) layer on and entirely covering the front surface of the semiconductor substrate; and a multi-stack on and entirely covering a surface of the SRB layer, wherein the SRB layer includes a silicon germanium (SiGe) epitaxial layer including germanium (Ge) at a first concentration of about 2.5 at % to about 18 at %, and the multi-stack has a superlattice structure in which a plurality of silicon (Si) layers and a plurality of SiGe layers are alternately provided.

The embodiments may be realized by providing an epitaxial wafer including a semiconductor substrate having a front surface and a rear surface opposite to each other; a strain relaxed buffer (SRB) layer on and entirely covering the front surface of the semiconductor substrate; and a multi-stack on the whole surface of the SRB layer, wherein the SRB layer includes a silicon germanium (SiGe) epitaxial layer including a lower layer and an upper layer, the lower layer has a concentration gradient of germanium (Ge) therein, the upper layer has a uniform concentration of Ge, the uniform concentration being a first concentration of about 2.5 at % to about 18 at %, and the multi-stack has a superlattice structure in which a plurality of silicon (Si) layers and a plurality of SiGe layers are alternately provided.

The embodiments may be realized by providing a semiconductor memory device including a semiconductor substrate having a front surface and a rear surface opposite to each other; a strain relaxed buffer (SRB) layer on and entirely covering the front surface of the semiconductor substrate, the SRB layer being formed by epitaxially growing silicon germanium (SiGe); a plurality of single-crystal silicon (Si) layers on the SRB layer, the plurality of single-crystal Si layers having the same lattice constant as the SRB layer and being arranged at equal intervals; a bit line on the front surface of the semiconductor substrate and extending through the plurality of single-crystal Si layers in a vertical direction; a transistor body portion including a first source/drain region connected to the bit line, a single-crystal channel layer, and a second source/drain region arranged sequentially in a first horizontal direction; a gate electrode layer extending in a second horizontal direction orthogonal to the first horizontal direction and covering an upper surface and a lower surface of the single-crystal channel layer with a gate dielectric layer therebetween; and a cell capacitor on an opposite side to the bit line from the transistor body portion in the first horizontal direction and including a lower electrode layer connected to the second source/drain region, a capacitor dielectric layer, and an upper electrode layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
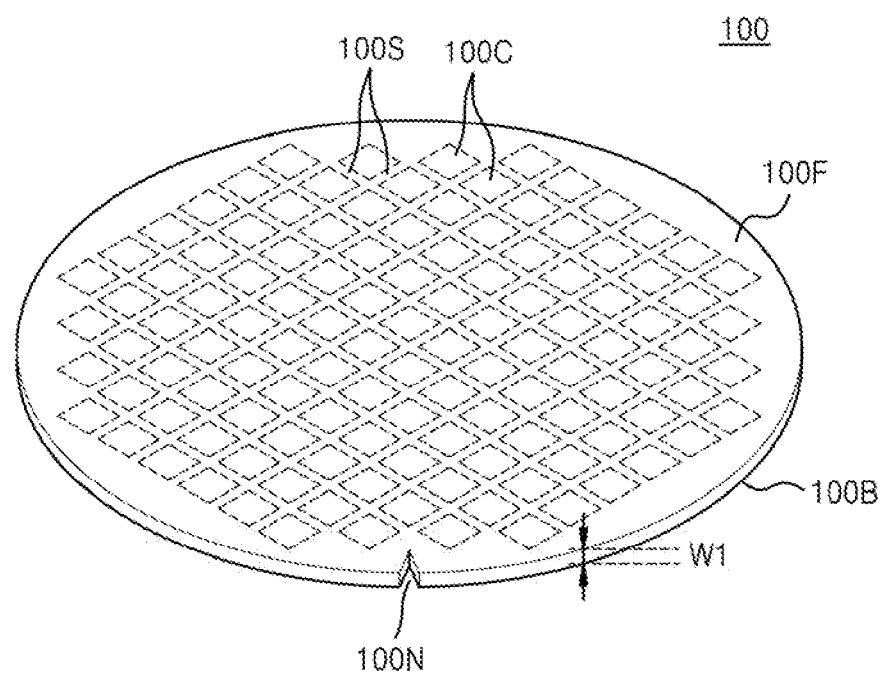
FIG. 1 is a perspective view of an epitaxial wafer according to an embodiment.

FIG. 1 is a perspective view of an epitaxial wafer according to an embodiment.

FIG. 1 illustrates an epitaxial wafer 100 including a plurality of semiconductor device regions 100C (e.g., regions where devices will be formed) and a plurality of scribe regions 100S (e.g., regions where the wafer will be cut).

The epitaxial wafer 100 may have a circular shape with a constant thickness W1. The epitaxial wafer 100 may include a notch 100N used as a reference point for wafer alignment.

In an implementation, the epitaxial wafer 100 may have a diameter of about 12 inches. In an implementation, an epitaxial wafer 100 having a diameter less than or greater than 12 inches may be used. In an implementation, the epitaxial wafer 100 may have the thickness W1 of about 0.1 mm to about 1 mm. If the thickness W1 of the epitaxial wafer 100 were to be too small (e.g., less than about 0.1 mm), a mechanical strength could be insufficient, and if the thickness W1 were to be too great (e.g., greater than about 1 mm), the time required for a subsequent etching process could increase, and thus, the productivity of a semiconductor memory device 10 (see FIG. 10) could be reduced.

The epitaxial wafer 100 may include an active surface 100F as a front-side surface and an inactive surface 100B as a back-side surface. The plurality of semiconductor device regions 100C correspond to regions to be respectively divided into separate semiconductor memory devices, one of which is the semiconductor memory device 10 (see FIG. 10), that will be formed on the active surface 100F of the epitaxial wafer 100.

In a process of forming a plurality of semiconductor devices, e.g., semiconductor memory devices, the plurality of semiconductor device regions 100C may be isolated from each other by the plurality of scribe regions 100S. The plurality of scribe regions 100S may each be referred to as a scribe lane. In an implementation, the plurality of semiconductor device regions 100C may be respectively surrounded by the plurality of scribe regions 100S to be isolated from each other. The epitaxial wafer 100 and various types of material films formed on the epitaxial wafer 100 may be scribed through a scribing process of scribing the plurality of scribe region 100S, and thus, the plurality of semiconductor device regions 100C may be respectively divided into a plurality of semiconductor memory devices, one of which is the semiconductor memory device 10 (see FIG. 10).

Figure 2:
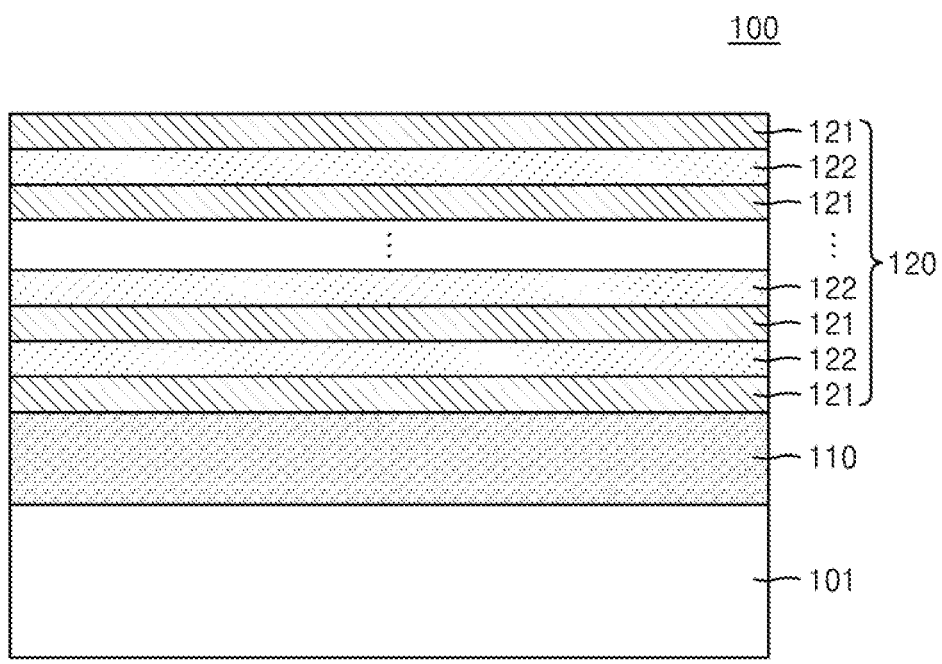
FIG. 2 is a cross-sectional view of an epitaxial wafer according to an embodiment.

FIG. 2 is a cross-sectional view of an epitaxial wafer according to an embodiment.

Referring to FIG. 2, the epitaxial wafer 100 may include a strain relaxed buffer (SRB) layer 110 on a semiconductor substrate 101, and a multi-stack 120 (e.g., on the SRB layer 110).

The semiconductor substrate 101 may include a single-crystal semiconductor material. In an implementation, the semiconductor substrate 101 may include a semiconductor material, e.g., silicon (Si) in the form of a single crystal. The semiconductor substrate 101 may include, e.g., an oxygen (O) element and one of a group III element or a group V element, as impurities. The group III element may include, e.g., boron (B), and the group V element may include, e.g., phosphorus (P).

The semiconductor substrate 101 may include a group III element or a group V element during ingot growth. In an implementation, the semiconductor substrate 101 may be obtained by growing a silicon (Si) ingot containing boron (B) to a preset size and slicing the ingot.

The SRB layer 110 may be on the whole or entire (e.g., may completely cover the) surface of the semiconductor substrate 101. The SRB layer 110 may be formed on the semiconductor substrate 101 through an epitaxial process. In an implementation, the SRB layer 110 may be formed through an epitaxial process during which the semiconductor substrate 101 is used as a seed.

In an implementation, the SRB layer 110 may include a silicon germanium (SiGe) epitaxial layer including germanium (Ge) at a first concentration of about 2.5 at % to about 18 at %. In an implementation, a thickness of the SRB layer 110 may be, e.g., at least about 2 μm. In an implementation, a degree of relaxation to the lattice strain of the SRB layer 110 may be about 95% or more. Details of numerical values are described in greater detail below.

The multi-stack 120 may be on the whole (e.g., may completely cover the entire) surface of the SRB layer 110. The multi-stack 120 may have a superlattice structure including a plurality of silicon (Si) layers 121 and a plurality of silicon germanium (SiGe) layers 122, which are alternately stacked with each other.

Each of the plurality of silicon (Si) layers 121 and the plurality of silicon germanium (SiGe) layers 122 included in the multi-stack 120 may be an epitaxial growth layer. All of the multi-stack 120 may be formed of an epitaxial growth layer. In an implementation, each of the plurality of silicon (Si) layers 121 and the plurality of silicon germanium (SiGe) layers 122 included in the multi-stack 120 may be an epitaxially grown layer in a substantially defect-free state. Details of the characteristics of the multi-stack 120 are described below.

The number of silicon (Si) layers 121 included in the multi-stack 120 may be, e.g., at least 80. In an implementation, one of the silicon (Si) layers 121 may be on or at the uppermost end of the multi-stack 120. In an implementation, one of the silicon (Si) layers 121 or one of the plurality of silicon germanium (SiGe) layers 122 may be at the lowermost end of the multi-stack 120. In an implementation, each of a plurality of semiconductor memory devices, one of which is the semiconductor memory device 10 (see FIG. 10), may be a three-dimensional semiconductor memory device in which a plurality of memory cells, each including a cell transistor TR (see FIG. 10) and a cell capacitor CAP (see FIG. 10), are vertically stacked, and a memory capacity may increase as the number of silicon (Si) layers 121 is increased.

Each of the plurality of silicon germanium (SiGe) layers 122 included in the multi-stack 120 may include germanium (Ge) at a second concentration of, e.g., about 10 at % to about 30 at %. In an implementation, the second concentration of germanium (Ge) included in the silicon germanium (SiGe) layer 122 may be greater than the first concentration of germanium (Ge) included in the SRB layer 110. In an implementation, an upper limit of the first concentration may be limited by a lower limit of the second concentration.

In an implementation, the plurality of silicon (Si) layers 121 and the plurality of silicon germanium (SiGe) layers 122 may each be formed of a single-crystal semiconductor material. In an implementation, each of the plurality of silicon (Si) layers 121 may have an etch selectivity with respect to each of the plurality of silicon germanium (SiGe) layers 122.

In an implementation, each of the plurality of silicon (Si) layers 121 and the plurality of silicon germanium (SiGe) layers 122 may be formed through a chemical vapor deposition (CVD) process, a plasma-enhanced CVD (PECVD) process, or an atomic layer deposition (ALD) process. In an implementation, the plurality of silicon (Si) layers 121 and the plurality of silicon germanium (SiGe) layers 122 may each be formed in a single-crystal state by using a layer in contact therewith as a seed layer or may be formed in a single-crystal state through a heat treatment process. As used herein, the term "or" is not an exclusive term, e.g., "A or B" would include A, B, or A and B.

In an implementation, the plurality of silicon (Si) layers 121 and the plurality of silicon germanium (SiGe) layers 122 may each have a thickness of about several nm to about several tens of nm. In an implementation, the multi-stack 120 may include the plurality of silicon (Si) layers 121 and the plurality of silicon germanium (SiGe) layers 122 having different thicknesses. In an implementation, the plurality of silicon (Si) layers 121 and the plurality of silicon germanium (SiGe) layers 122 may be formed to have substantially the same thickness.

Figure 3:
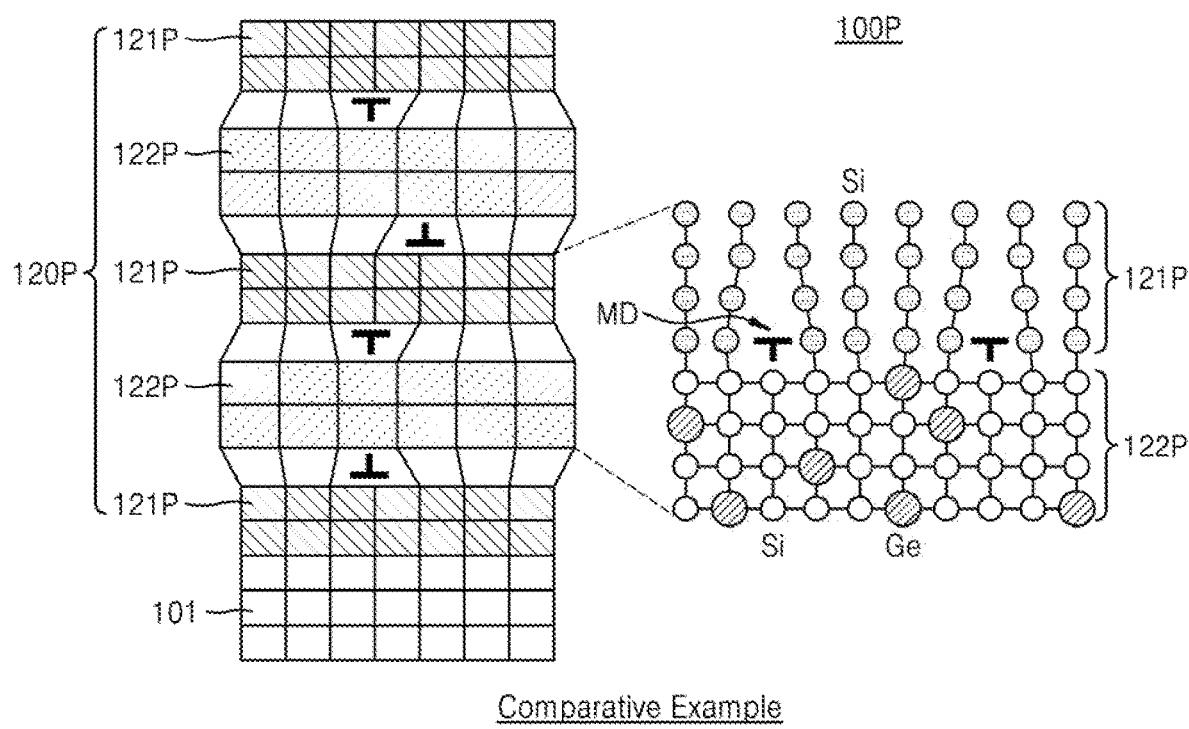
FIG. 3 is a conceptual diagram of a lattice structure of an epitaxial wafer according to a Comparative Example.

FIG. 3 is a conceptual diagram of a lattice structure of an epitaxial wafer according to a Comparative Example.

Referring to FIG. 3, an epitaxial wafer 100P according to a Comparative Example may include a multi-stack 120P directly formed on a semiconductor substrate 101 without forming an SRB layer 110 (see, e.g., FIG. 4) on the semiconductor substrate 101.

According to the Comparative Example in which the SRB layer (serving as a buffer) is not formed between the semiconductor substrate 101 and the multi-stack 120P, the epitaxial wafer 100P may be in a metastable state or an unstable state that may cause a lattice mismatch between the semiconductor substrate 101 and the multi-stack 120P as illustrated in FIG. 3.

In this case, a plurality of silicon layers 121P or a plurality of silicon germanium layers 122P included in the multi-stack 120P may receive strain due to the lattice mismatch. When the number of silicon layers 121P and the number of silicon germanium layers 122P is relatively small, the plurality of silicon layers 121P or the plurality of silicon germanium layers 122P may withstand the strain. When the number of silicon layers 121P and the number of silicon germanium layers 122P is relatively large, a misfit dislocation (MD) may propagate in the plurality of silicon layers 121P or the plurality of silicon germanium layers 122P for strain relaxation due to an inherent property of a material as illustrated.

Accordingly, the semiconductor memory device 10 (see FIG. 10) that uses the plurality of silicon layers 121P included in the multi-stack 120P as channel regions of cell transistors may have a misfit dislocation (MD) due to a lattice mismatch and defects resulting therefrom, and thus, it may be difficult to manufacture a highly reliable semiconductor memory device.

Figure 4:
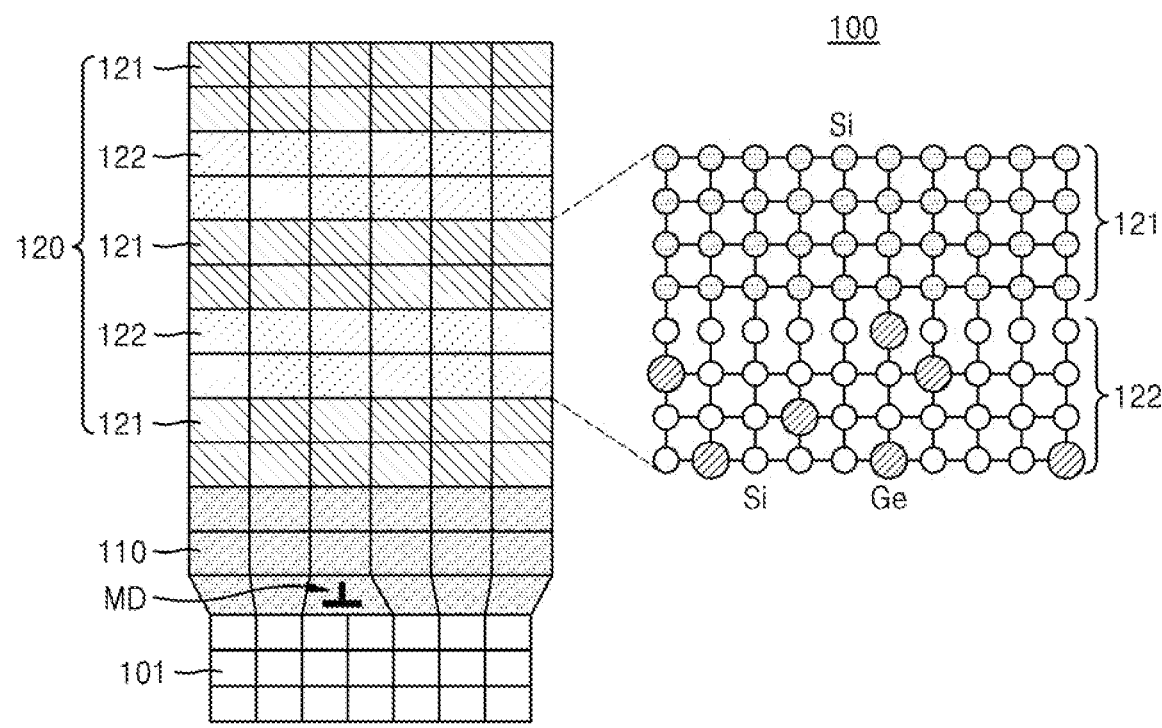
FIG. 4 is a conceptual diagram of a lattice structure of an epitaxial wafer according to an embodiment.

FIG. 4 is a conceptual diagram of a lattice structure of an epitaxial wafer according to an embodiment.

Referring to FIG. 4, the epitaxial wafer 100 may be on a semiconductor substrate 101 and includes an SRB layer 110 with a lattice defect such as a misfit dislocation (MD) and a multi-stack 120 without a lattice defect.

In order for each of the plurality of silicon (Si) layers 121 and the plurality of silicon germanium (SiGe) layers 122 constituting the multi-stack 120 to include a single-crystal semiconductor material in a defect-free state, the following conditions may be satisfied.

Lattice constants of the plurality of silicon (Si) layers 121 may be substantially the same as lattice constants of the plurality of silicon germanium (SiGe) layers 122. In an implementation, the multi-stack 120 may have a superlattice structure.

In order to form the multi-stack 120 in a defect-free state on the SRB layer 110, a concentration of germanium (Ge) in the SRB layer 110 may be secured to reduce the limit of a critical thickness according to lattice strain that may be caused by the multi-stack 120.

According to the Matthews-Blakeslee model, a critical thickness $h_c$ of the multi-stack 120 may be obtained from lattice strain f between heterogeneous membranes (a silicon layer and a silicon germanium layer). Here, a relationship between the critical thickness $h_c$ and the lattice strain f may be represented by the following Equation 1.

$$h_C = \frac{b(1 - v\cos^2\alpha)}{2\pi|f|(1 + v)\cos\lambda}\left(\ln\frac{h_C}{b} + 1\right) \qquad \text{Equation 1}$$

In Equation 1, b is a Burgers's vector, v is a Poisson ratio, α is an angle between a dislocation line and the Burgers's vector, and λ is an angle between a slip direction and a membrane direction.

In addition, the lattice strain f between the heterogeneous membranes (a silicon layer and a silicon germanium layer) in the multi-stack 120 may be obtained from the following Equation 2.

$$|f| = \frac{a_{MS} - a_{SRB}}{a_{SRB}} \qquad \text{Equation 2}$$

In Equation 2, $a_{MS}$ represents a lattice constant of the multi-stack 120, and $a_{SRB}$ represents a lattice constant of the SRB layer 110.

Combining Equation 1 with Equation 2 to summarize $a_{SRB}$, the lattice constant $a_{SRB}$ required for the SRB layer 110 may be represented by the following Equation 3.

$$a_{SRB} = a_{MS}\left(\left(\pm\frac{b(1 - v\cos^2\alpha)}{2\pi h_C(1 + v)\cos\lambda}\right)\cdot\left(\ln\frac{h_C}{b} + 1\right) + 1\right)^{-1} \qquad \text{Equation 3}$$

In order to obtain the lattice constant $a_{MS}$ of the multi-stack 120 in Equation 3, it is necessary to understand a structure of the multi-stack 120. Each of the plurality of silicon (Si) layers 121 and the plurality of silicon germanium (SiGe) layers 122 constituting the multi-stack 120 may have a random thickness. Here, a thickness of each of the plurality of silicon (Si) layers 121 is referred to as $t_{MS,Si}$, and a thickness of each of the plurality of silicon germanium (SiGe) layers 122 is referred to as $t_{MS,SiGe}$. In addition, a second concentration of germanium (Ge) in the plurality of silicon germanium (SiGe) layers 122 in the multi-stack 120 is referred to as $C_{MS,SiGe}$, which may be in a range of about 10 at % to about 30 at %, as described above.

In addition, as described above, the multi-stack 120 may have a superlattice structure. In this case, the lattice constant $a_{MS}$ of the multi-stack 120 may be represented by the following Equation 4.

$$a_{MS} = \frac{\frac{B_{MS,Si}t_{MS,Si}}{a_{Si}} + \frac{B_{MS,SiGe}t_{MS,SiGe}}{a_{SiGe}}}{\frac{B_{MS,Si}t_{MS,Si}}{a_{Si}^2} + \frac{B_{MS,SiGe}t_{MS,SiGe}}{a_{SiGe}^2}} \qquad \text{Equation 4}$$

In Equation 4, $a_{Si}$ and $t_{MS,Si}$ respectively represent a lattice constant and a thickness of the silicon (Si) layer 121, $a_{SiGe}$ and $t_{MS,SiGe}$ respectively represent a lattice constant and a thickness of the silicon germanium (SiGe) layer 122, $B_{MS,Si}$ represents a material constant of the silicon (Si) layer 121, and $B_{MS,SiGe}$ represents a material constant of the silicon germanium (SiGe) layer 122. Here, it is assumed that the lattice constant and the material constant are numerical values of materials in a bulk state not subjected to strain.

By substituting the lattice constant $a_{MS}$ of the multi-stack 120 obtained by Equation 4 into Equation 3, the lattice constant $a_{SRB}$ required for the SRB layer 110 may be obtained.

Going back to the beginning, a concentration of germanium (Ge) included in the SRB layer 110 may be adjusted to cause the multi-stack 120 to have a superlattice structure. In order to obtain the concentration of germanium (Ge) included in the SRB layer 110, a following equation may be used.

Germanium (Ge) may be included in the SRB layer 110 in a substitutional type. In an implementation, silicon (Si) atoms may be replaced with germanium (Ge) atoms. According to Vegard's Law, a lattice constant of a solution is proportional to a concentration of solute atoms. A lattice constant change of silicon (Si) due to a change in the concentration of germanium (Ge) may be given by Vegard's Law represented by the following Equation 5.

$$a_{SRB}=5.431+0.20x+0.027x^2 \text{(at 300K)} \qquad \text{Equation 5}$$

In Equation 5, x represents the concentration of germanium (Ge) included in the SRB layer 110. A lattice constant of pure Si may be about 5.431 Å at a temperature of about 300K. In Equation 5, the lattice constant $a_{SRB}$ of the SRB layer 110 obtained above is used to obtain the concentration of germanium (Ge) in the SRB layer 110.

A lattice constant of the SRB layer 110 including germanium (Ge) may be increased compared to a lattice constant of the semiconductor substrate 101, and the higher the first concentration of germanium (Ge), the greater the amount of change in the lattice constant of the SRB layer 110. Accordingly, a misfit dislocation (MD) (see FIG. 3) in the multi-stack 120P (see FIG. 3) according to the Comparative Example may not be in the multi-stack 120 according to the embodiment. In an implementation, a misfit dislocation (MD) may be under the SRB layer 110 according to the embodiment.

Ultimately, the epitaxial wafer 100 according to an embodiment may provide a structure of the multi-stack 120 suitable for use in a manufacturing process of the semiconductor memory device 10 (see FIG. 10) with high reliability. In an implementation, the epitaxial wafer 100 according to an embodiment may include the SRB layer 110 to help reduce a misfit dislocation (MD) due to a lattice mismatch in the multi-stack 120 and defects resulting therefrom, and thus, there may be an effect that may be useful for manufacturing the semiconductor memory device 10 (see FIG. 10) with reduced defects.

Figure 5:
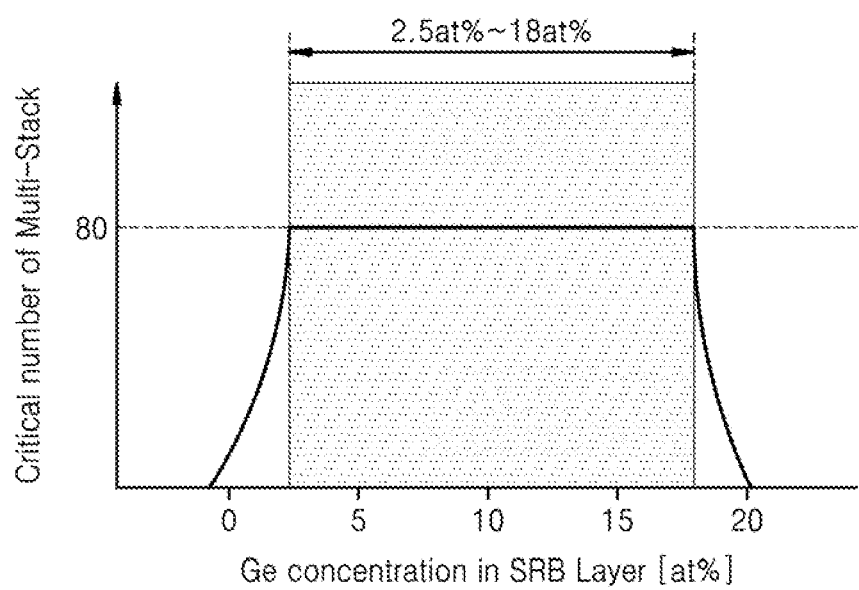
FIG. 5 is a graph illustrating a relationship between a concentration of germanium (Ge) in a strain relaxed buffer (SRB) layer and the number of layers of a multi-stack, according to an embodiment.

FIG. 5 is a graph of a relationship between a concentration of germanium (Ge) in an SRB layer and the number of layers of a multi-stack, according to an embodiment.

Referring to FIG. 5, the horizontal axis represents the concentration of germanium (Ge) in the SRB layer, and the vertical axis represents the number of layers of the multi-stack.

Due to a change in lattice constant according to the concentration of germanium (Ge) in the SRB layer, a lattice mismatch may not occur in the multi-stack. an implementation, the SRB layer may include a silicon germanium (SiGe) epitaxial layer including germanium (Ge) with a first concentration of, e.g., about 2.5 at % to about 18 at %. In this state, lattice defects may not occur in the multi-stack having a superlattice structure, as described in the above equation.

In an implementation, there may be no change in lattice constant of a silicon layer and a silicon germanium layer constituting the multi-stack, and thus, a lattice mismatch may not occur between the silicon layer and the silicon germanium layer. Accordingly, there may be no misfit dislocation in a multi-stack of an epitaxial wafer.

In an implementation, the number of stacked silicon layers constituting the multi-stack may be at least 80. Theoretically, there is no limit to the number of stacked silicon layers, but the number of stacked silicon layers may be limited in reality.

Figure 6:
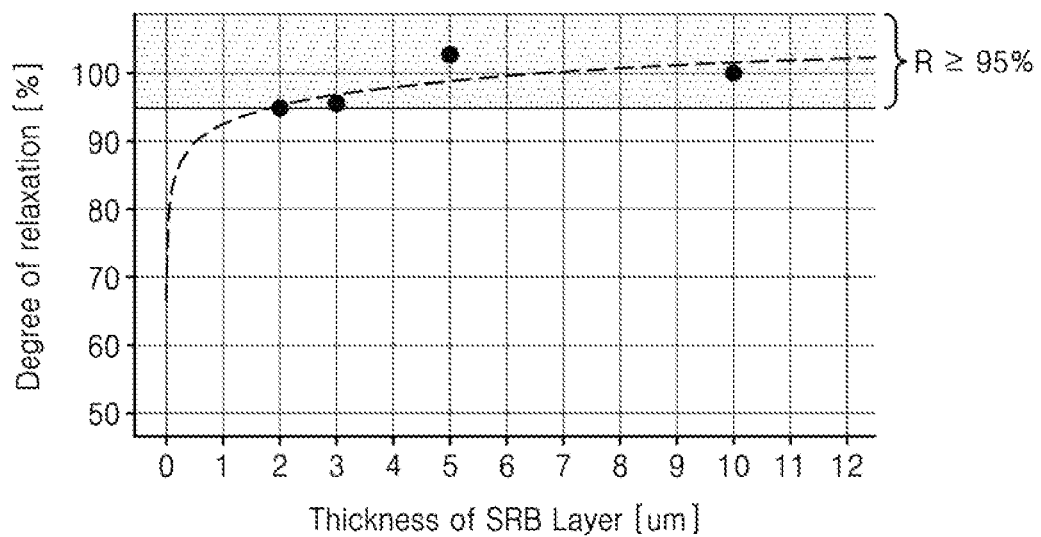
FIG. 6 is a graph illustrating a relationship between a thickness of an SRB layer and a degree of relaxation, according to an embodiment.

FIG. 6 is a graph of a relationship between a thickness of an SRB layer and a degree of relaxation, according to an embodiment.

Referring to FIG. 6, the horizontal axis represents a thickness of an SRB layer, and the vertical axis represents a degree of relaxation of the SRB layer.

Under the condition of a first concentration of germanium (Ge) in the SRB layer, a thickness of the SRB layer for full relaxation may be set. To this end, a change in the degree of relaxation R according to the thickness of the SRB layer is diagrammed at a first concentration of germanium (Ge) in the SRB layer. Here, the degree of relaxation R is a value measured based on an HR-XRD reciprocal space map (RSM) facility. Considering a significance level of the facility, a region of about 95% or more may be regarded as being fully relaxed. It may be seen that the thickness of the SRB layer may be least about 2 μm to satisfy about 95% or more of the degree of relaxation R.

As a result, when the thickness of the SRB layer is at least about 2 μm, the degree of relaxation R to lattice strain of the SRB layer may be about 95% or more (when considering a significance level of facility).

Figure 7:
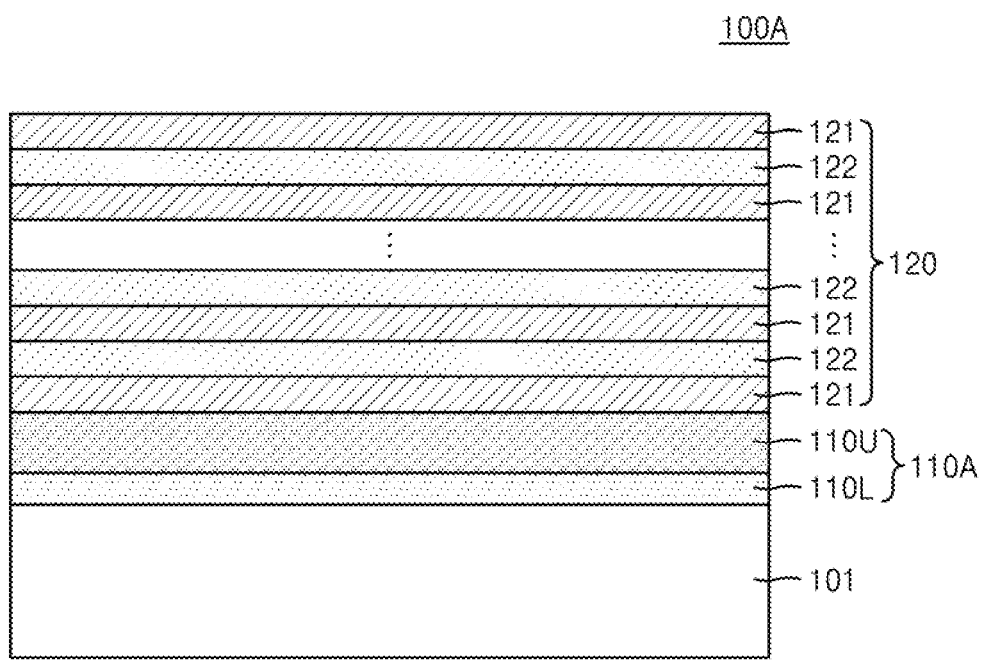
FIG. 7 is a cross-sectional view of an epitaxial wafer according to another embodiment.

FIG. 7 is a cross-sectional view of an epitaxial wafer according to another embodiment.

Most of the components constituting the epitaxial wafer 100A and materials constituting the components described below may be substantially the same as or similar to the above description made with reference to FIGS. 1 to 6. Therefore, for the sake of convenient description, description will be focused on differences from the epitaxial wafer 100 described above.

Referring to FIG. 7, an epitaxial wafer 100A may include an SRB layer 110A and a multi-stack 120 on a semiconductor substrate 101.

In an implementation, the SRB layer 110A may be on or may cover the whole, e.g., entire, surface of the semiconductor substrate 101. The SRB layer 110A may be formed on the semiconductor substrate 101 through an epitaxial process. In an implementation, the SRB layer 110A may be formed through an epitaxial process during which the semiconductor substrate 101 is used as a seed.

In an implementation, the SRB layer 110A may include a silicon germanium (SiGe) epitaxial layer including a lower layer 110L in which a concentration of germanium (Ge) is graded (e.g., the Ge concentration forms a gradient) and an upper layer 110U in which the concentration of germanium (Ge) is fixed (e.g., a uniform or constant concentration) at a first concentration of, e.g., about 2.5 at % to about 18 at %.

In an implementation, a concentration of germanium (Ge) in a portion where the lower layer 110L of the SRB layer 110A is in contact with a front surface of the semiconductor substrate 101 may be about 0 at %. In an implementation, a concentration of germanium (Ge) in a portion where the lower layer 110L of the SRB layer 110A is in contact with the upper layer 110U may be about the first concentration. In an implementation, a concentration of germanium (Ge) in the lower layer 110L of the SRB layer 110A may have a concentration gradient such that the Ge concentration gradually increases as a distance from a front surface of the semiconductor substrate 101 increases in a vertical direction.

In an implementation, a thickness of the lower layer 110L of the SRB layer 110A may be less than a thickness of the upper layer 110U, and a total thickness of the lower layer 110L and the upper layer 110U of the SRB layer 110A may be, e.g., at least about 2 μm.

In an implementation, a degree of relaxation to the lattice strain of the SRB layer 110A may be about 95% or more. A lattice constant of the upper layer 110U of the SRB layer 110A may be substantially the same as a lattice constant of the multi-stack 120.

The lattice constant of the SRB layer 110A including germanium (Ge) may be gradually increased compared to a lattice constant of the semiconductor substrate 101, and as the first concentration of germanium (Ge) increases, the amount of change in lattice constant of the SRB layer 110A may be increased. Accordingly, the misfit dislocation (MD) (see FIG. 3) in the multi-stack 120P according to the Comparative Example (see FIG. 3) may not be in the multi-stack 120 according to an embodiment. In an implementation, the misfit dislocation may be in the lower layer 110L of the SRB layer 110A according to the embodiment.

In an implementation, the epitaxial wafer 100A may provide a structure of the multi-stack 120 suitable for use in a manufacturing process of the semiconductor memory device 10 (see FIG. 10) with high reliability. In an implementation, the epitaxial wafer 100A may include the SRB layer 110A to help reduce a misfit dislocation (MD) due to a lattice mismatch in the multi-stack 120 and defects resulting therefrom, and thus, there may be an effect that may be useful for manufacturing the semiconductor memory device 10 (see FIG. 10) with reduced defects.

Figure 8:
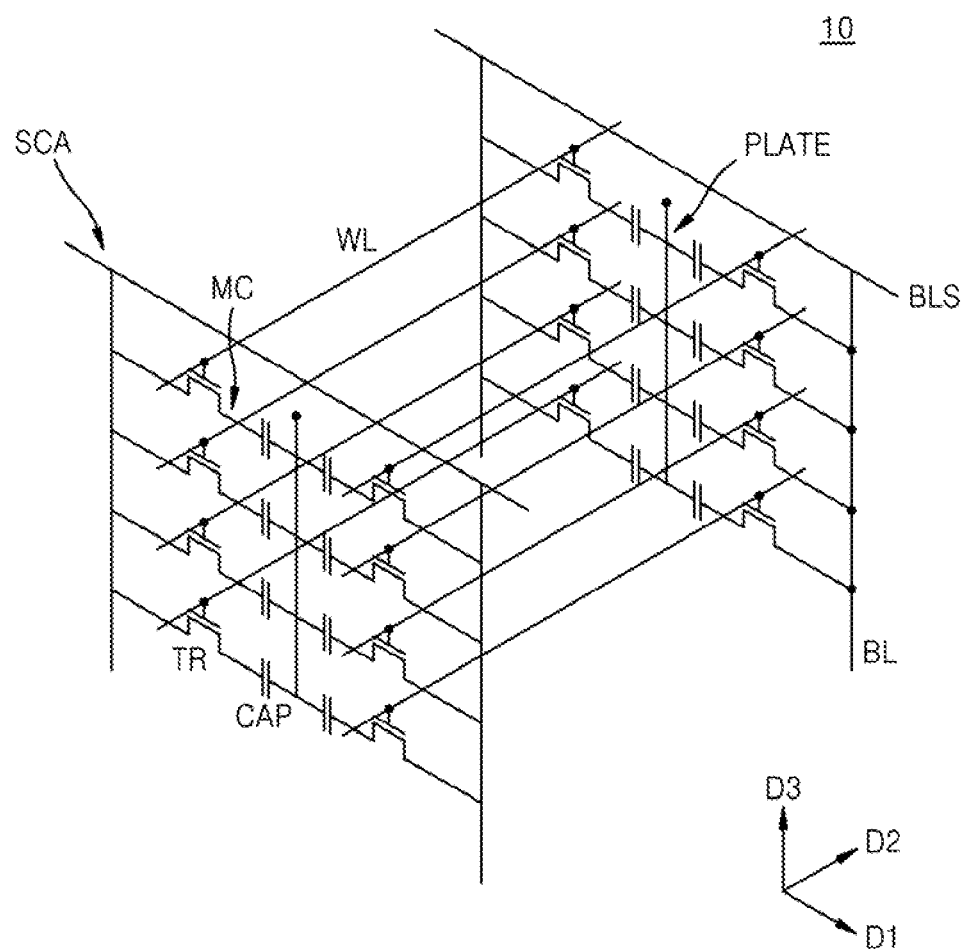
FIG. 8 is an equivalent circuit diagram of a cell array of a semiconductor memory device according to an embodiment.

FIG. 8 is an equivalent circuit diagram of a cell array of a semiconductor memory device according to an embodiment.

Referring to FIG. 8, a semiconductor memory device 10 may include a plurality of memory cells MC that include a plurality of cell transistors TR and a plurality of cell capacitors CAP arranged in a first horizontal direction D1 and connected to each other.

The plurality of memory cells MC may be separated from each other in the first horizontal direction D1 and a vertical direction D3 and may be arranged in a column to configure a sub-cell array SCA. In an implementation, the semiconductor memory device 10 may include a plurality of sub-cell arrays SCA arranged to be separated from each other in a second horizontal direction D2.

A plurality of word lines WL may extend in the second horizontal direction D2 and arranged in the first horizontal direction D1 and the vertical direction D3 to be separated from each other. A plurality of bit lines BL may extend in the vertical direction D3 and arranged in the first horizontal direction D1 and the second horizontal direction D2 to be separated from each other.

In an implementation, some of the plurality of bit lines BL may be connected to each other by a bit line strapping line BLS extending in the first horizontal direction D1. In an implementation, the bit line strapping line BLS may connect the bit lines BL, to each other, arranged in the first horizontal direction D1 among the plurality of bit lines BL.

The plurality of cell capacitors CAP may be commonly connected to an upper electrode PLATE extending in the second horizontal direction D2 and the vertical direction D3. In an implementation, as illustrated in FIG. 8, the upper electrode PLATE may extend in the vertical direction D3, or upper electrodes arranged in the second horizontal direction D2 may be formed in one body as the upper electrode PLATE.

The plurality of cell capacitors CAP arranged in the first horizontal direction D1 may be symmetrical to the plurality of cell transistors TR arranged in the first horizontal direction D1, based on a surface extending in the vertical direction D3 in which the upper electrode PLATE is arranged.

Figure 9:
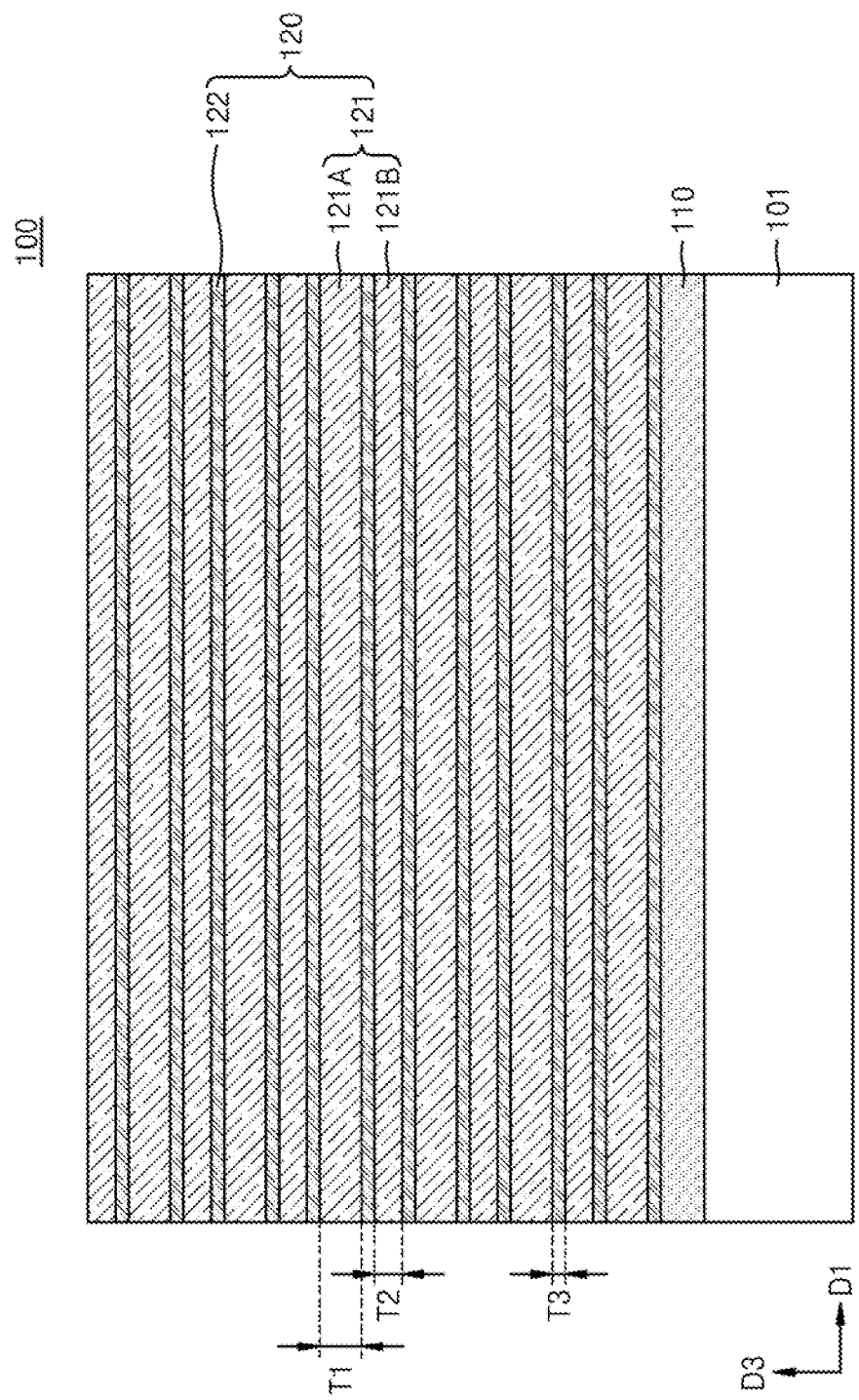
FIG. 9 is a cross-sectional view of an epitaxial wafer used in a semiconductor memory device according to an embodiment.

FIG. 9 is a cross-sectional view of an epitaxial wafer used in a semiconductor memory device according to an embodiment.

Referring to FIG. 9, an epitaxial wafer 100 may include an SRB layer 110 and a multi-stack 120, which are on a semiconductor substrate 101.

The semiconductor substrate 101 may include a single-crystal semiconductor material. The SRB layer 110 may be on, e.g., may completely cover, the whole surface of the semiconductor substrate 101. The multi-stack 120 may be on the whole surface of the SRB layer 110. The multi-stack 120 may have a superlattice structure in which a plurality of silicon (Si) layers 121 alternate with a plurality of silicon germanium (SiGe) layers 122.

The epitaxial wafer 100 used in the semiconductor memory device 10 (see FIG. 10) according to an embodiment may include all of the characteristics described above with reference to FIGS. 1 to 6.

In an implementation, the plurality of silicon (Si) layers 121 may include a plurality of first silicon layers 121A and a plurality of second silicon layers 121B having different thicknesses from each other. The plurality of first silicon layers 121A and the plurality of second silicon layers 121B may be alternately arranged one by one in the vertical direction D3. In an implementation, the plurality of first silicon layers 121A and the plurality of second silicon layers 121B may be provided respectively and alternately on the plurality of silicon germanium (SiGe) layers 122 separated from each other in the vertical direction D3.

Each of the plurality of silicon (Si) layers 121 and the plurality of silicon germanium (SiGe) layers 122 may have a thickness (e.g., in the vertical direction D3) of about several nm to about several tens of nm. The plurality of first silicon layers 121A may each have a first thickness T1, the plurality of second silicon layers 121B may each have a second thickness T2, and the plurality of silicon germanium (SiGe) layers 122 may have a third thickness T3. In an implementation, the first thickness T1 may be greater than the second thickness T2. The third thickness T3 may be less than each of the first thickness T1 and the second thickness T2.

In an implementation, the plurality of silicon (Si) layers 121 may have substantially the same thickness as the plurality of silicon germanium (SiGe) layers 122. In an implementation, the first thickness T1, the second thickness T2, and the third thickness T3 may be substantially the same as each other.

Figure 10:
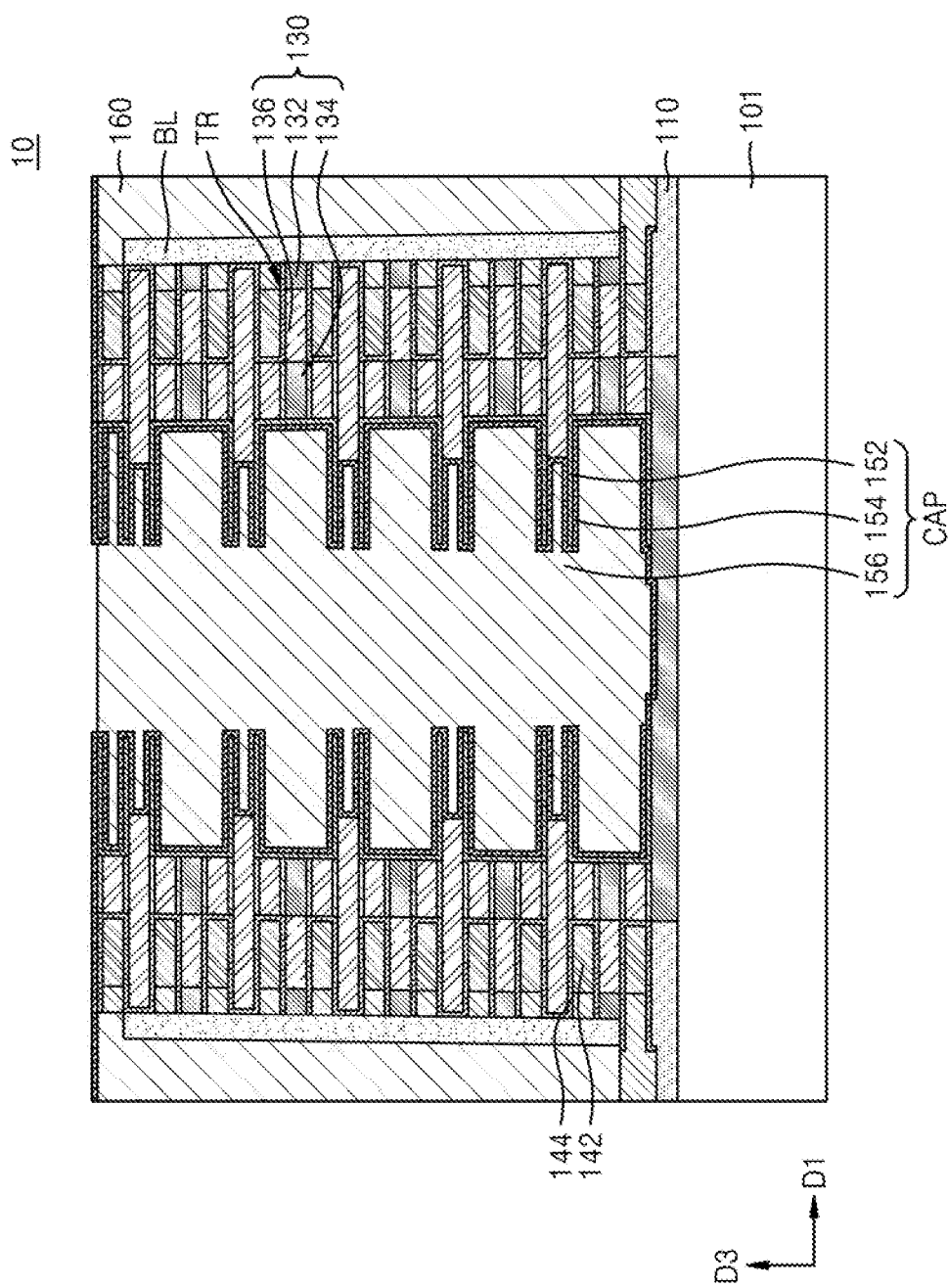
FIG. 10 is a cross-sectional view of the semiconductor memory device according to the embodiment.

In the process of manufacturing the semiconductor memory device 10 (see FIG. 10) according to an embodiment, the plurality of silicon germanium (SiGe) layers 122 may serve as sacrificial layers, and thus, the plurality of silicon germanium (SiGe) layers 122 may not be included in a final structure of the semiconductor memory device 10 (see FIG. 10).

FIG. 10 is a cross-sectional view of the semiconductor memory device according to the embodiment.

FIG. 10 illustrates a three-dimensional semiconductor memory device 10 in which the plurality of memory cells MC (see FIG. 8) respectively including a plurality of cell transistors TR and a plurality of cell capacitors CAP are vertically stacked.

In the epitaxial wafer 100 (see FIG. 9), the semiconductor memory device 10 may have a plurality of bit lines BL extending parallel to each other in a vertical direction D3 to be separated from each other in a first horizontal direction D1 and a second horizontal direction D2 over the semiconductor substrate 101. The plurality of bit lines BL may be covered by a buried insulating layer 160.

The semiconductor memory device 10 may include the plurality of memory cells MC (see FIG. 8) respectively including the plurality of cell transistors TR, each including one of a plurality of transistor body portions 130, one of a plurality of gate dielectric layers 144, and one of a plurality of gate electrode layers 142, and the plurality of cell capacitors CAP, each including one of a plurality of lower electrode layers 152, one of a plurality of capacitor dielectric layers 154, and one of a plurality of upper electrode layers 156.

The plurality of transistor body portions 130 may extend parallel to each other in the first horizontal direction D1 to be separated from each other in the second horizontal direction D2 and the vertical direction D3. The plurality of transistor body portions 130 may each include one of a plurality of first source/drain regions 132, one of a plurality of single-crystal channel layers 136, and one of a plurality of second source/drain regions 134 sequentially arranged in the first horizontal direction D1, and the plurality of first source/drain regions 132 may be connected to any one of the plurality of bit lines BL. The plurality of transistor body portions 130 may be arranged in the first horizontal direction D1 from the plurality of bit lines BL connected to the plurality of first source/drain regions 132.

The plurality of cell capacitors CAP may be respectively connected to the plurality of second source/drain regions 134 of the plurality of transistor body portions 130. The plurality of transistor body portions 130 and the plurality of cell capacitors CAP may be sequentially arranged in the first horizontal direction D1 from the plurality of bit lines BL connected to the plurality of first source/drain regions 132 of the plurality of transistor body portions 130.

The plurality of gate electrode layers 142 may extend parallel to each other in the second horizontal direction D2 to be separated from each other in the first horizontal direction D1 and the vertical direction D3. In an implementation, the gate electrode layer 142 may have a double gate shape covering upper and lower surfaces of the single-crystal channel layer 136. In an implementation, the gate electrode layer 142 may have a gate all around shape integrally covering the upper surface, the lower surface, and both sides in the second horizontal direction D2 of the single-crystal channel layer 136.

The gate dielectric layer 144 may be between the gate electrode layer 142 and the single-crystal channel layer 136. When the gate electrode layer 142 has the double gate shape, the gate dielectric layer 144 may cover the upper and lower surfaces of the single-crystal channel layer 136. When the gate electrode layer 142 has a gate all-around shape, the gate dielectric layer 144 may integrally cover the upper surface, the lower surface, and both sides in the second horizontal direction D2 of the single-crystal channel layer 136.

The lower electrode layer 152 may be connected to the second source/drain region 134. The lower electrode layer 152 may have a hollow cylindrical shape in which a portion facing the second source/drain region 134 is closed and a portion facing an opposite side of the second source/drain region 134 is open. The lower electrode layer 152 may have a vertical cross-section in which an open portion faces the upper electrode layer 156 and a closed portion faces the second source/drain region 134.

The lower electrode layer 152 may include, e.g., a metal, a conductive metal nitride, conductive metal silicide, or a combination thereof. In an implementation, the lower electrode layer 152 may include a layer formed of a high-melting point metal, e.g., cobalt, titanium, nickel, tungsten, or molybdenum.

The capacitor dielectric layer 154 may be formed of, e.g., a high-k dielectric material with a dielectric constant higher than a dielectric constant of a silicon oxide and a ferroelectric material. In an implementation, the capacitor dielectric layer 154 may include, e.g., a metal oxide or a dielectric material having a perovskite structure.

The upper electrode layer 156 may be formed of, e.g., doped silicon, Ru, RuO, Pt, PtO, Ir, IrO, SRO(SrRuO), BSRO((Ba,Sr)RuO), CRO(CaRuO), BaRuO, La(Sr,Co)O, Ti, TiN, W, WN, Ta, TaN, TiAlN, TiSiN, TaAlN, TaSiN, or a combination thereof.

The transistor body portion 130 and the cell capacitor CAP may be sequentially arranged in the first horizontal direction D1 from the bit line BL.

The plurality of single-crystal channel layers 136 of the plurality of transistor body portions 130 included in the semiconductor memory device 10 according to an embodiment may be some of the plurality of silicon (Si) layers 121 described with reference to FIGS. 1 to 6. As described with reference to FIGS. 1 to 6, the plurality of silicon (Si) layers 121 may be formed of a single-crystal semiconductor material on the semiconductor substrate 101 including the SRB layer 110, and the plurality of silicon (Si) layers 121 and the plurality of silicon germanium (SiGe) layers 122 serving as sacrificial layers may be alternately stacked thereover. As such, the plurality of silicon (Si) layers 121 may have excellent single-crystal characteristics in a forming step thereof, and thus, the plurality of single-crystal channel layers 136 may also have excellent single-crystal characteristics.

Accordingly, the plurality of memory cells MC (see FIG. 8) included in the semiconductor memory device 10 according to an embodiment may have increased storage capacities and uniform operation reliability.

By way of summation and review, a misfit dislocation due to a lattice mismatch and defects resulting therefrom may be reduced for semiconductor memory devices manufactured by using epitaxial wafers.

One or more embodiments may provide an epitaxial wafer having a structure suitable for use in a manufacturing process of a highly reliable semiconductor memory device.

One or more embodiments may provide an epitaxial wafer having a structure suitable for use in a manufacturing process of a highly reliable semiconductor memory device.

One or more embodiments may provide a semiconductor memory device using an epitaxial wafer that may reduce a misfit dislocation due to a lattice mismatch and defects resulting therefrom.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An epitaxial wafer, comprising:
a semiconductor substrate having a front surface and a rear surface opposite to each other;
a strain relaxed buffer (SRB) layer on and entirely covering the front surface of the semiconductor substrate; and
a multi-stack on and entirely covering a surface of the SRB layer,
wherein:
the SRB layer includes a silicon germanium (SiGe) epitaxial layer including germanium (Ge) at a first concentration of about 2.5 at % to about 18 at %, wherein the first concentration is an amount that causes a lattice constant of the SRB layer to be between a lattice constant of the semiconductor substrate and an overall lattice constant of the multi-stack,
the multi-stack has a superlattice structure in which a plurality of silicon (Si) layers and a plurality of SiGe layers are alternately provided, and
the overall lattice constant is an effective lattice constant of the multi-stack that depends at least on:
a thickness of a respective Si layer of the plurality of Si layers;
a thickness of a respective SiGe layer of the plurality of SiGe layers;
a lattice constant of the respective Si layer; and
a lattice constant of the respective SiGe layer.

2. The epitaxial wafer as claimed in claim 1, wherein:
each of the plurality of SiGe layers included in the multi-stack includes Ge at a second concentration of about 10 at % to about 30 at %, and
the first concentration is less than the second concentration.

3. The epitaxial wafer as claimed in claim 2, wherein a thickness of the SRB layer is at least 2 μm.

4. The epitaxial wafer as claimed in claim 3, wherein a degree of relaxation to lattice strain of the SRB layer is about 95% or more.

5. The epitaxial wafer as claimed in claim 1, wherein:
a number of Si layers included in the multi-stack is at least 80, and
one Si layer of the plurality of Si layers is at an uppermost end of the multi-stack.

6. The epitaxial wafer as claimed in claim 5, wherein:
each Si layer of the plurality of Si layers included in the multi-stack includes an epitaxial growth layer, and
each SiGe layer of the plurality of SiGe layers included in the multi-stack includes an epitaxial growth layer.

7. The epitaxial wafer as claimed in claim 1, wherein the plurality of Si layers and the plurality of SiGe layers included in the multi-stack are substantially defect-free.

8. The epitaxial wafer as claimed in claim 1, wherein a lattice constant of an upper layer of the SRB layer is substantially the same as the overall lattice constant of the multi-stack based on the superlattice structure of the multi-stack.

9. The epitaxial wafer as claimed in claim 1, wherein the semiconductor substrate includes a Si single-crystal substrate.

10. The epitaxial wafer as claimed in claim 9, wherein the semiconductor substrate includes an oxygen (O) element and a group III element or a group V element as impurities.

11. An epitaxial wafer, comprising:
a semiconductor substrate having a front surface and a rear surface opposite to each other;
a strain relaxed buffer (SRB) layer on and entirely covering the front surface of the semiconductor substrate; and
a multi-stack on the whole surface of the SRB layer,
wherein:
the SRB layer includes a silicon germanium (SiGe) epitaxial layer including a lower layer and an upper layer,
the lower layer has a concentration gradient of germanium (Ge) therein,
the upper layer has a uniform concentration of Ge, the uniform concentration being a first concentration of about 2.5 at % to about 18 at % wherein the first concentration is an amount that causes a lattice constant of the SRB layer to be between a lattice constant of the semiconductor substrate and an overall lattice constant of the multi-stack,
the multi-stack has a superlattice structure in which a plurality of silicon (Si) layers and a plurality of SiGe layers are alternately provided, and
the overall lattice constant is based on the superlattice structure of the multi-stack and depends at least on a lattice constant of a respective Si layer of the plurality of Si layers and a lattice constant of a respective SiGe layer of the plurality of SiGe layers.

12. The epitaxial wafer as claimed in claim 11, wherein:
a concentration of Ge in a portion of the lower layer of the SRB layer in contact with the front surface of the semiconductor substrate is about 0 at %, and
a concentration of Ge in a portion of the lower layer of the SRB layer in contact with the upper layer is about the same as the first concentration.

13. The epitaxial wafer as claimed in claim 11, wherein:
a thickness of the lower layer of the SRB layer is less than a thickness of the upper layer of the SRB layer, and
a total thickness of the lower layer and the upper layer of the SRB layer is at least 2 μm.

14. The epitaxial wafer as claimed in claim 11, wherein a lattice constant of the upper layer of the SRB layer is substantially the same as a lattice constant of the multi-stack.

15. The epitaxial wafer as claimed in claim 11, wherein:
each Si layer of the plurality of Si layers and each SiGe layer of the plurality of SiGe layers included in the multi-stack includes an epitaxial growth layer,
the multi-stack includes at least 80 Si layers, and
one Si layer of the plurality of Si layers is at an uppermost end of the multi-stack.

16. A semiconductor memory device, comprising:
a semiconductor substrate having a front surface and a rear surface opposite to each other;
a strain relaxed buffer (SRB) layer on and entirely covering the front surface of the semiconductor substrate, the SRB layer being formed by epitaxially growing silicon germanium (SiGe);
a plurality of single-crystal silicon (Si) layers on the SRB layer, the plurality of single-crystal Si layers having the same lattice constant as the SRB layer and being arranged at equal intervals,
wherein the SRB layer includes germanium (Ge) at a first concentration of about 2.5 at % to about 18 at %, wherein the first concentration is an amount that causes a lattice constant of the SRB layer to be between a lattice constant of the semiconductor substrate and an overall lattice constant of a multi-stack that includes the plurality of single-crystal silicon (Si) layers, the overall lattice constant based on a superlattice structure of the multi-stack and depending at least on a lattice constant of each respective layer of the multi-stack;

a bit line on the front surface of the semiconductor substrate and extending through the plurality of single-crystal Si layers in a vertical direction;

a transistor body portion including a first source/drain region connected to the bit line, a single-crystal channel layer, and a second source/drain region arranged sequentially in a first horizontal direction;

a gate electrode layer extending in a second horizontal direction orthogonal to the first horizontal direction and covering an upper surface and a lower surface of the single-crystal channel layer with a gate dielectric layer therebetween; and a cell capacitor on an opposite side to the bit line from the transistor body portion in the first horizontal direction and including a lower electrode layer connected to the second source/drain region, a capacitor dielectric layer, and an upper electrode layer.

17. The semiconductor memory device as claimed in claim 16, wherein:
   a thickness of the SRB layer is at least 2 μm, and
   a degree of relaxation to lattice strain of the SRB layer is about 95% or more.

18. The semiconductor memory device as claimed in claim 16, wherein:
   the plurality of single-crystal Si layers includes at least 80 single-crystal Si layers, and
   the single-crystal channel layer is formed over at least some of the plurality of single-crystal Si layers.

19. The semiconductor memory device as claimed in claim 18, wherein:
   the single-crystal channel layer is a channel region of a cell transistor, and
   the plurality of single-crystal Si layers are epitaxially grown layers and substantially defect-free.

* * * * *